US012595552B2

(12) United States Patent
Nataraj et al.

(10) Patent No.: US 12,595,552 B2
(45) Date of Patent: Apr. 7, 2026

(54) MODULE FOR FLIPPING SUBSTRATES IN VACUUM

(71) Applicant: Applied Materials, Inc., Santa Clara, CA (US)

(72) Inventors: Karunakaran Nataraj, Coimbatore (IN); Sathiyamurthi Govindasamy, Coimbatore (IN); Suresh Palanisamy, Coimbatore (IN); Harish V. Penmethsa, Dublin, CA (US); Naresh Kumar Asokan, Coimbatore (IN)

(73) Assignee: Applied Materials, Inc., Santa Clara, CA (US)

( * ) Notice: Subject to any disclaimer, the term of this patent is extended or adjusted under 35 U.S.C. 154(b) by 127 days.

(21) Appl. No.: 18/106,365

(22) Filed: Feb. 6, 2023

(65) Prior Publication Data

US 2024/0263299 A1     Aug. 8, 2024

(51) Int. Cl.
*C23C 14/50*          (2006.01)
*C23C 14/52*          (2006.01)

(52) U.S. Cl.
CPC ............ *C23C 14/505* (2013.01); *C23C 14/52* (2013.01)

(58) Field of Classification Search
CPC .................................... C23C 14/505
USPC ..................................... 204/298.14
See application file for complete search history.

(56) References Cited

U.S. PATENT DOCUMENTS

| | | | | |
|---|---|---|---|---|
| 6,286,452 | B1 * | 9/2001 | Namiki | ............... C23C 14/505 204/192.12 |
| 2014/0113458 | A1 | 4/2014 | Pan et al. | |

| | | | | |
|---|---|---|---|---|
| 2018/0144966 | A1 * | 5/2018 | Kim | ..................... H01L 31/18 |
| 2018/0174873 | A1 | 6/2018 | Miller | |
| 2022/0197128 | A1 | 6/2022 | Gautam et al. | |

FOREIGN PATENT DOCUMENTS

| | | | | |
|---|---|---|---|---|
| CN | 111793787 A | * | 10/2020 | ............ C23C 14/24 |
| CN | 212335277 U | | 1/2021 | |
| CN | 114361088 A | | 4/2022 | |
| JP | 2011-063845 A | | 3/2011 | |
| KR | 10-2007-0093746 A | | 9/2007 | |
| KR | 10-2013-0041089 A | | 4/2013 | |
| KR | 20130041089 | * | 4/2013 | |
| KR | 10-2013-0088536 A | | 8/2013 | |
| KR | 20130088536 A | * | 8/2013 | |

OTHER PUBLICATIONS

International Search Report and Written Opinion dated May 1, 2024 for Application No. PCT/US2024/011005.
International Search Report dtd Dec. 6, 2022 for Application No. PCT/US2022/041389.

* cited by examiner

*Primary Examiner* — John J Brayton

(74) *Attorney, Agent, or Firm* — Patterson + Sheridan, LLP

(57)          ABSTRACT

Apparatus and methods for flipping substrates in vacuum between PVD sputtering of each side for increasing throughput are provided herein. In some embodiments disclosed herein, a module of a processing system for flipping a substrate in vacuum is provided. The module includes a clamp assembly for securing the substrate, a motor assembly coupled to the substrate clamp assembly, for rotating the clamp assembly, a lift pin assembly, and a lift pin actuator for raising and lowering the lift pin assembly.

13 Claims, 13 Drawing Sheets

200

| TRANSFERRING A SUBSTRATE INTO A FLIPPER MODULE HAVING A CLAMP ASSEMBLY IN AN OPEN POSITION | 202 |

| SECURING THE SUBSTRATE IN THE CLAMP ASSEMBLY | 204 |

| ROTATING THE CLAMP ASSEMBLY BY ABOUT 180° | 206 |

| RELEASING THE SUBSTRATE FROM THE CLAMP ASSEMBLY | 208 |

| TRANSFERRING THE SUBSTRATE OUT OF THE FLIPPER MODULE | 210 |

MODULE FOR FLIPPING SUBSTRATES IN VACUUM

BACKGROUND

Field

Embodiments of the present disclosure generally relate to apparatus and methods of processing substrates in an electronic device fabrication system, and more particularly, to apparatus and methods for flipping substrates in vacuum between deposition processes performed on opposing sides of a substrate.

Description of the Related Art

Substrate processing in electronic device fabrication often involves performing a deposition process on both sides of a substrate. However, process chambers are typically designed for depositing material on only one surface at a time, such as on the upper or lower surface of the substrate. Therefore, it is often necessary to flip or re-reorient the substrate in relation to the chamber between deposition processes.

This is a particular challenge when processing some large-area substrates, such as panels. For example, a common panel size may be 600 mm by 600 mm. Common panel materials can include Ajinomoto Build-up Film (ABF), Copper Clad Laminate (CCL), panel with polymer on top, glass, etc. Because of the large surface area of the polymer material on the panels, the panels absorb a lot of moisture. Therefore, to achieve good contact resistance a very efficient degas is required to remove all outgassing from the panels and remove contamination.

In order to perform PVD sputtering on both sides of a substrate/panel, in conventional designs the substrate/panel is removed from vacuum and flipped in atmosphere. When the substrate/panel is removed from vacuum, an additional degassing operation is required to remove moisture absorbed on the substrate/panel. Since degassing can take tens of minutes, such as about 40 minutes in some cases, this additional degassing operation very negatively affects panel throughput.

There have been attempts to hold substrates/panels vertically in the PVD chamber in order to sputter from both sides simultaneously. However, with this approach, there is no active cooling to the substrate/panel and undesirable arcing can occur, which can damage the panel.

Accordingly, there is a need in the art for apparatus and methods for flipping substrates in vacuum between depositions steps performed on each side of a panel.

SUMMARY

Embodiments described herein generally relate to dual sided physical vapor deposition (PVD) sputtering of substrates in an electronic device fabrication process. More particularly, embodiments described herein provide apparatus and methods for flipping substrates in vacuum between PVD sputtering of each side.

In one embodiment, a module of a processing system includes a clamp assembly capable of securing a substrate. The clamp assembly includes a first plate, a second plate parallel to the first plate. The second plate movably coupled to the first plate in a direction perpendicular to a major plane of the first plate. The clamp assembly also includes a plurality of guide-blocks, a plurality of finger-stock assemblies coupled to the guide-blocks, a motor assembly coupled to the clamp assembly, an actuator coupled to a lift pin plate, and a plurality of sensors.

In another embodiment, a processing system, includes a deposition chamber, a transfer chamber coupled to the deposition chamber, and a load lock chamber coupled to the transfer chamber. The load lock chamber comprises a module. The module includes a clamp assembly. The clamp assembly includes a first plate, a second plate parallel to the first plate, the second plate movably coupled to the first plate in a direction perpendicular to a major plane of the first plate, a plurality of guide-blocks, and a plurality of finger-stock assemblies coupled to the plurality of guide-blocks. The clamp assembly also includes a backstop, and a plurality of sensors.

In yet another embodiment, a method for rotating a substrate, includes raising a lift pin plate to open a clamp assembly and receive a substrate, wherein the light pin plate is coupled to an actuator. Receiving the substrate on a plurality of lift pins, wherein the plurality of lift pins are coupled to the lift pin plate. Sensing the substrate with a sensor from a plurality of sensors. Lowering the lift pin plate to close the clamp assembly. Rotating the substrate in vacuum and raising the lift pin plate to open the clamp assembly and to support the substrate with the lift pins.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to dual sided physical vapor deposition (PVD) processes performed on substrates in an electronic device fabrication system. More particularly, embodiments described herein provide apparatus and methods for flipping substrates in vacuum between PVD processes, such as sputtering, on each side of a substrate.

Embodiments described herein enable the ability to deposit a material on both sides of a substrate without removing the substrate from vacuum, in contrast to conventional approaches in which the substrates are removed from vacuum and flipped in atmosphere. Performing this process in vacuum eliminates an additional degassing operation and increases throughput.

Embodiments described herein have the ability to deposit a material on both sides of a substrate without holding the substrate vertically. Performing a sputtering process on a substrate that is positioned flat and horizontally on a substrate support enables active cooling and prevents undesirable arcing.

Embodiments described herein provide apparatus for flipping substrates in vacuum within a load lock chamber without increasing a footprint of either existing or new processing systems. Embodiments described herein enable flipping of large area substrates in vacuum in addition to conventional substrates.

Exemplary Substrate Processing System

Figure 1:
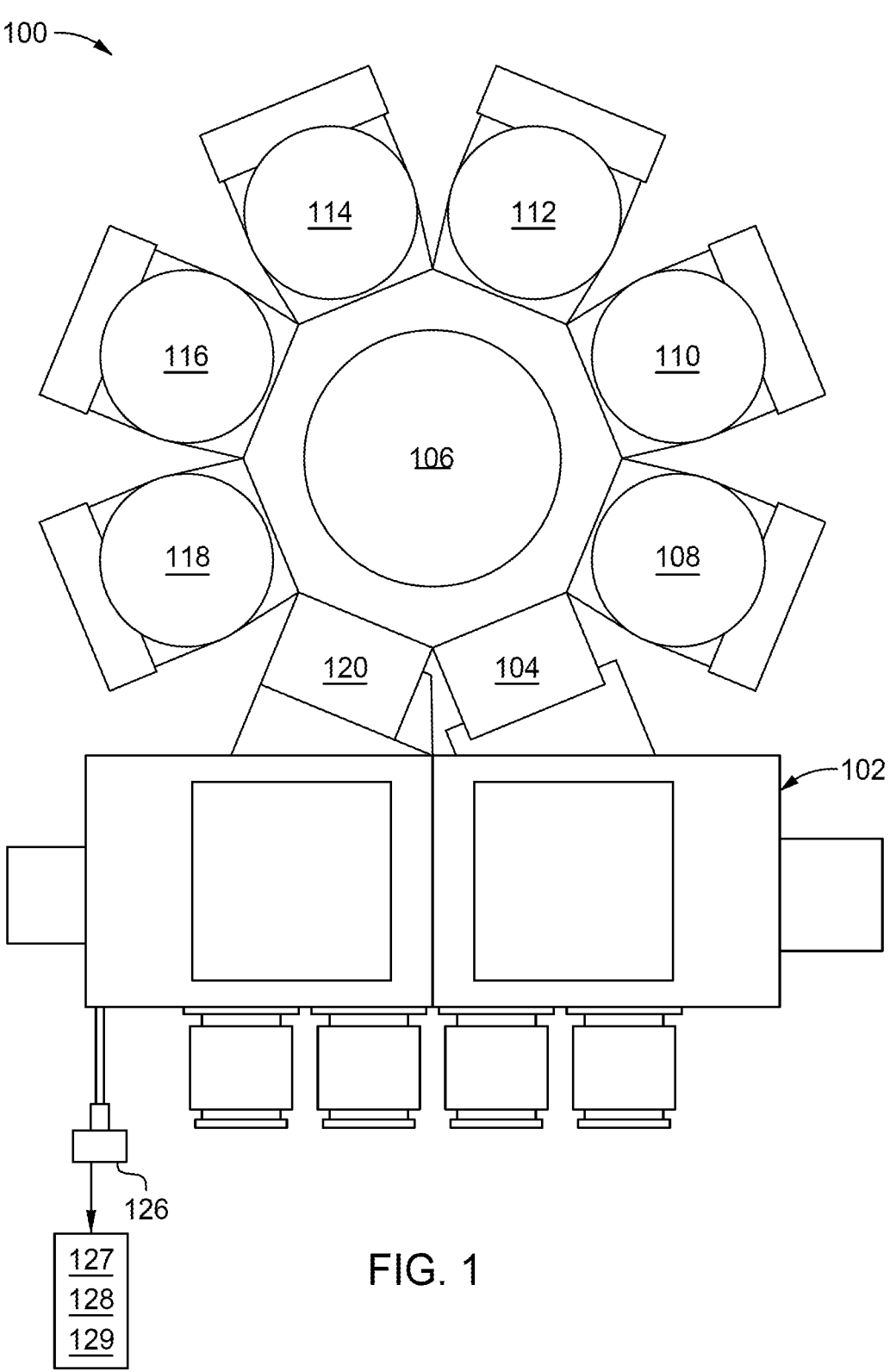
FIG. 1 is a schematic top view of an exemplary substrate processing system, according to certain embodiments.

FIG. 1 is a schematic top view of an exemplary substrate processing system 100 (also referred to as a "processing platform"), according to certain embodiments. In certain embodiments, the substrate processing system 100 is particularly configured for processing large-area substrates. As used herein, the term "panel" may refer to a large-area substrate that can be used in the formation of device packages or large panel displays. In some device packaging examples, a "panel" may include a large surface area substrate that includes a polymer material disposed over structural core. The substrate processing system 100 generally includes an equipment front-end module (EFEM) 102 for loading substrates into the processing system 100, a first load lock chamber 104 coupled to the EFEM 102, a transfer chamber 106 coupled to the first load lock chamber 104, and a plurality of other chambers coupled to the transfer chamber 106 as described in detail below. Proceeding counterclockwise around the transfer chamber 106 from the first load lock chamber 104, the processing system 100 includes a first dedicated degas chamber 108, a first pre-clean chamber 110, a first deposition chamber 112, a second pre-clean chamber 114, a second deposition chamber 116, a second dedicated degas chamber 118, and a second load lock chamber 120. The second load lock chamber 120 includes a flipper module for flipping a substrate in vacuum, as described in more detail below. In certain embodiments, the vacuum is created using a turbomolecular pump coupled to the second load lock chamber 120. However, other types of vacuum pumps are also contemplated. In certain embodiments, the transfer chamber 106 and each chamber coupled to the transfer chamber 106 are at vacuum. As used herein, the term "vacuum" may refer to pressures below about $10^{-2}$ Pa. However, some high-vacuum systems may operate below $10^{-7}$ Pa.

In certain embodiments a system controller 126, also referred to herein as a processing chamber controller, includes a central processing unit (CPU) 127, a memory 128, and support circuits 129. The system controller 126 is used to control a process sequence when processing the substrate 122, including the substrate transferring and substrate flipping methods described herein. The CPU 127 is a general-purpose computer processor configured for use in an industrial setting for controlling the processing system 100 and sub-processors related thereto. The memory 128 described herein, which is generally non-volatile memory, may include random access memory, read-only memory, floppy or hard disk drive, or other suitable forms of digital storage, local or remote. The support circuits 129 are conventionally coupled to the CPU 127 and may comprise cache, clock circuits, input/output subsystems, power supplies, and the like, and combinations thereof. Software instructions (i.e., software program) and data can be coded and stored within the memory 128 for instructing a processor within the CPU 127. A software program readable by CPU 127 in the system controller 126 determines which tasks are performable by the components in the processing system 100. Typically, the software program, which is readable by CPU 127 in the system controller 126, includes code, which, when executed by the processor (CPU 127), performs tasks relating to the processing and substrate transfer schemes described herein. The software program may include instructions that are used to control the various hardware and electrical components within the processing system 100 so that the methods described herein can be performed. In one embodiment, the program includes instructions that are used to perform one or more of the methods of flipping a substrate described herein.

In certain embodiments, substrates are loaded into the processing system 100 through a door (also referred to as a "slit valve"), in the first load lock chamber 104 and unloaded from the processing system 100 through a door in the second load lock chamber 120. In certain embodiments, a stack of substrates is supported in a cassette, which is placed in the first load lock chamber 104. Once the first load lock chamber 104 is pumped down, one substrate at a time is retrieved from the cassette using a robot located in the transfer chamber 106. In one embodiment, the second load lock chamber 120 receives a single substrate after processing has been performed on each side and unloads the processed substrate to the EFEM 102. The second load lock chamber 120 may be a dual chamber including an upper chamber 125 (FIG. 3A) for receiving the substrate after both sides have been processed and unloading the substrate to the EFEM 102, and a lower portion including a flipper module 130 (FIG. 3A) for flipping a substrate having one side processed in order to process the other side. However, other loading and unloading configurations are also contemplated.

Pre-cleaning of the substrates is important to remove impurities, such as oxides, from the substrate surface, so that metal films deposited in the deposition chambers are not electrically insulated from the substrate. By performing pre-cleaning in the first and second pre-clean chambers 110, 114 that share the same vacuum environment as the first and second deposition chambers 112, 116, the substrates can be transferred from the cleaning chambers to the deposition chambers without being exposed to atmosphere. This pre-vents formation of impurities on the substrates during the transfer. In addition, vacuum pump-down cycles are reduced since a vacuum is maintained in the substrate processing system 100 during transfer of the cleaned substrates to the deposition chambers.

In certain embodiments, only one substrate is processed within each pre-clean and deposition chamber at a time. Alternatively, multiple substrates may be processed at one time, such as four to six substrates. In such embodiments, the substrates may be disposed on a rotatable pedestal within the respective chambers. In certain embodiments, the first and second pre-clean chambers 110, 114 are pre-clean etch chambers for etching the substrate surface. However, other types of pre-clean chambers are also contemplated. In certain embodiments, one or both of the pre-clean chambers are replaced with a deposition chamber for performing a reactive sputtering process, such as deposition of silicon nitride, aluminum oxide, or other materials by reactive sputtering. In an Inductively Coupled Plasma (ICP) chamber, a coil at the top of the chamber is energized with an external RF source to create an excitation field in the chamber. Argon gas flows through the chamber from an external gas source. The argon atoms in the chamber are ionized (charged) by the RF energy. The substrate is biased by a DC biasing source coupled to an aluminum pedestal on which the substrate sits. The charged atoms are attracted to the substrate resulting in etching of the substrate surface. Other gases besides argon may be used depending on the desired etch rate and the materials to be etched. An ionization energy level may be relatively low for etching as part of a cleaning process in contrast to a process for etching features in the substrate surface. The lower energy avoids damaging circuit devices and features already formed on the substrate.

In certain embodiments, the first and second deposition chambers 112, 116 are PVD chambers. In such embodiments, the PVD chambers may be configured to deposit copper, titanium, aluminum, gold, nickel, nickel vanadium, silver, and/or tantalum. However, other types of deposition processes and materials are also contemplated. In a PVD chamber, an entire back surface of the substrate is in electrical and thermal contact with the pedestal. Controlling the temperature of the substrate is important during the sputtering process to obtain a predictable and reliable thin film. A coolant system includes an external cooling source that supplies fluid to cooling lines in the pedestal. The cooling source may be replaced or augmented with a heating source to increase the work piece temperature independent of the sputtering process.

In certain embodiments, an RF bias source is electrically coupled to the pedestal to energize the pedestal and thus energize the substrate during the sputtering process. Substrate bias (RF bias) may be used where the substrates/panels have features that require good step coverage, for example. Alternatively, the pedestal may be grounded, floated, or biased with only a DC voltage source.

In operation, the PVD deposition chamber is evacuated and back filled with argon gas. The gas is energized with a DC source to couple an electromagnetic field inside the PVD deposition chamber to excite a sustained high-density plasma near the target surface. The plasma confined near the target surface contains positive ions (such as Ar+) and free electrons. The ions in the plasma strike the target surface and sputter material off the target. The substrate receives the sputtered material to form a deposited layer on the substrate surface. In one example, as much as 20 kilowatts of DC power can be provided on the target enabling the target to deposit approximately 1 micron per minute of material on the substrate.

The PVD deposition chamber uses a magnetron assembly, outside the vacuum, to further control the bombardment of the target by ions formed in the plasma. In certain embodiments, a fixed permanent magnet is located behind the target (serving as a deposition source), so that the plasma is confined to the target area. In other cases, magnets are scanned across the backside of the target to help distribute the magnetic field evenly across the target for more even target erosion. The resulting magnetic field forms a closed-loop annular path acting as an electron trap that reshapes the trajectories of the secondary electrons ejected from the target into a cycloidal path, greatly increasing the probability of ionization of the sputtering gas within the confinement zone. Inert gases, such as argon, are usually employed as the sputtering gas because they tend not to react with the target material or combine with any process gases and because they produce higher sputtering and deposition rates due to their high molecular weight. Positively charged argon ions from the plasma are accelerated toward the negatively biased target and impact the target, resulting in material being sputtered from the target surface.

The chamber wall is typically electrically grounded in processing operations. A bias voltage on the substrate can drive a flux of an electrically charged species (Ar+ and/or atoms sputtered off the target) to the substrate. The flux can modify the properties, such as film density, of the sputtered material deposited on a surface of the substrate.

Figure 2:
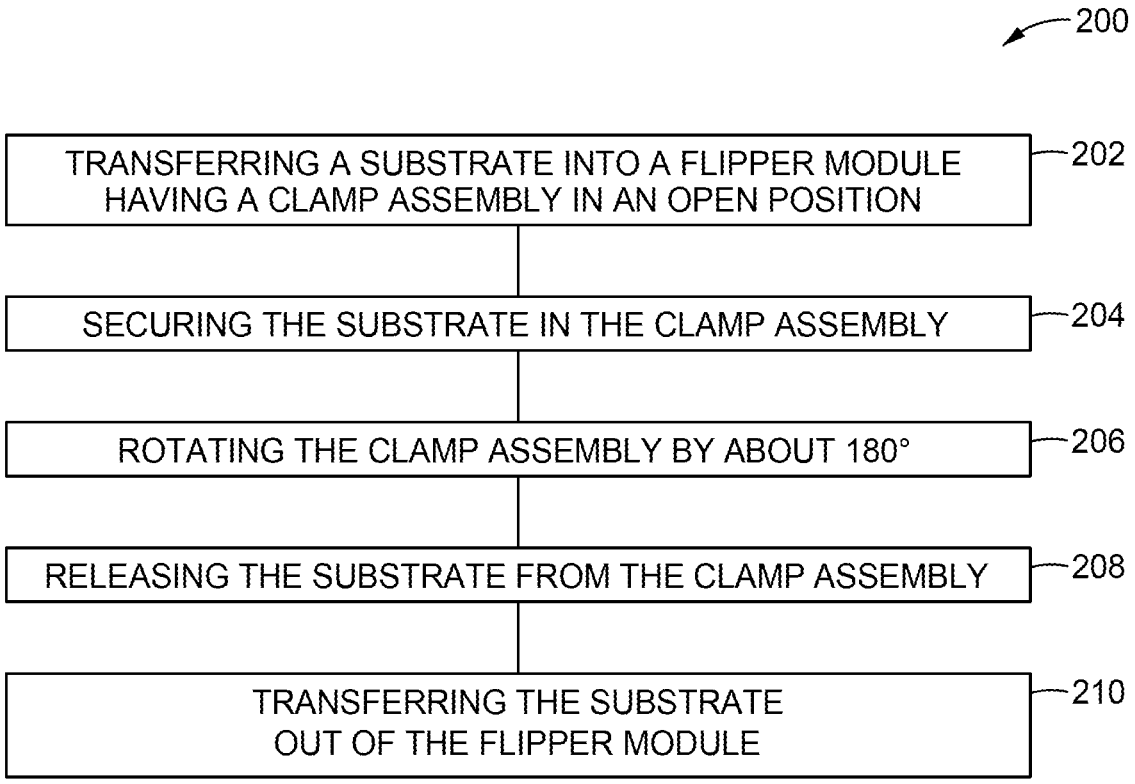
FIG. 2 is a diagram illustrating a method of flipping a substrate in vacuum using a flipper module, according to certain embodiments.

FIG. 2 is a diagram illustrating a method 200 of flipping a substrate 122 in vacuum using a flipper module 130 of the second load lock chamber 120, according to certain embodiments. As discussed below, the process of flipping a substrate may be performed between deposition processes performed on opposing sides of a substrate. Thus, by interleaving a flipping step between deposition steps on opposing sides of a substrate, a first side of a substrate can receive a deposited material, while the opposing second side of the substrate, which is opposite to the side receiving the deposited material, is supported by and actively cooled and/or biased by elements in the substrate supporting member in the deposition chamber.

Exemplary Flipper Module Description

Figure 3A:
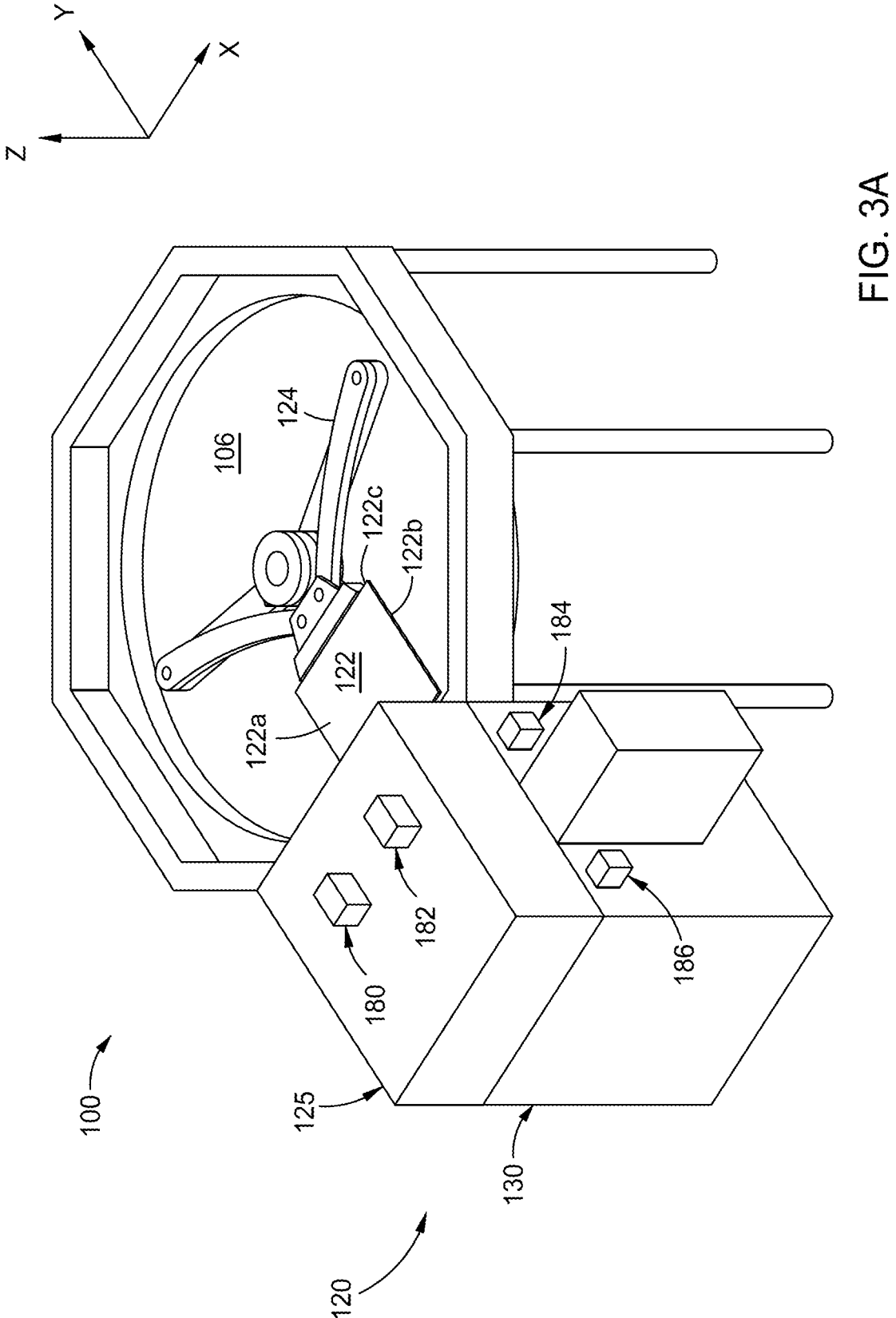
FIG. 3A is a schematic top isometric view of a portion of the substrate processing system of FIG. 1 including a flipper module, according to certain embodiments.

FIG. 3A is a schematic top isometric view of a portion of the substrate processing system 100 illustrated in FIG. 1, according to certain embodiments. As shown, the load lock chamber 120 is configured to receive and unload a substrate 122 during processing and includes an upper chamber 125, and a flipper module 130 configured to receive a substrate 122 processed, for example, on a front side 122*a* and flip the substrate 122 for processing on the backside 122*b*.

As illustrated in FIG. 3A, a substrate 122 is disposed in the transfer chamber 106. Note that in FIG. 3A, only the transfer chamber 106 and the flipper module 130 of the second load lock chamber 120 are shown for clarity. An edge of the substrate 122*c* is in contact with an end effector of a transfer robot 124. The substrate 122 and the end effector of the transfer robot 124 are aligned with a door of the flipper module 130 of the load lock chamber 120. According to some embodiments, a front side 122*a* of the substrate 122 is facing upwards, and a backside 122*b* is facing down. The substrate 122 can have a thickness in a range from about 0.1 mm to about 4 mm, for example in a range from about 0.2 mm to about 3.2 mm. In the example, the substrate 122 is a panel (also referred to herein as a "substrate").

Figure 4A:
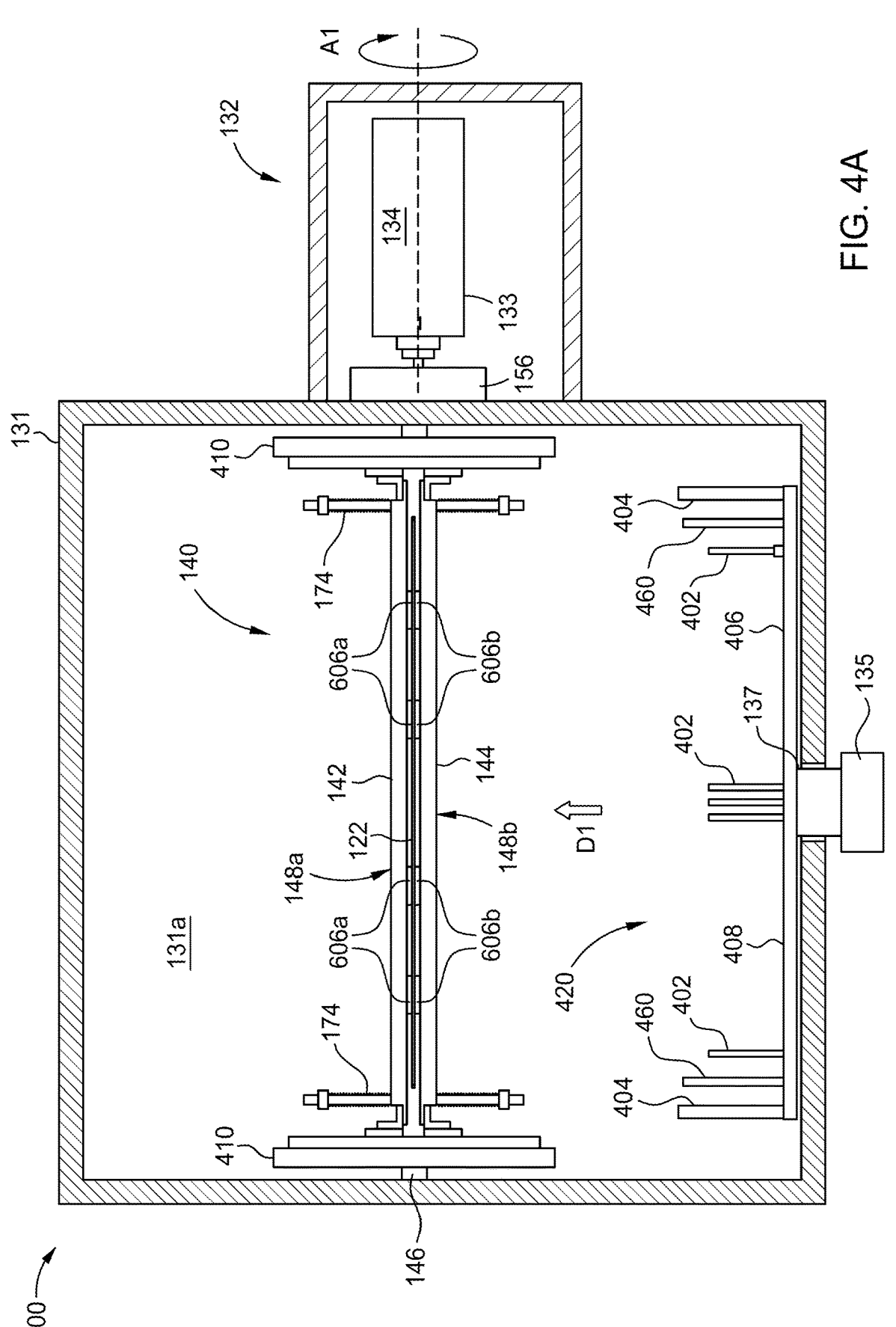
FIG. 4A is partial side cross-sectional views of the flipper module in the closed position, according to certain embodiments.
Figure 5A:
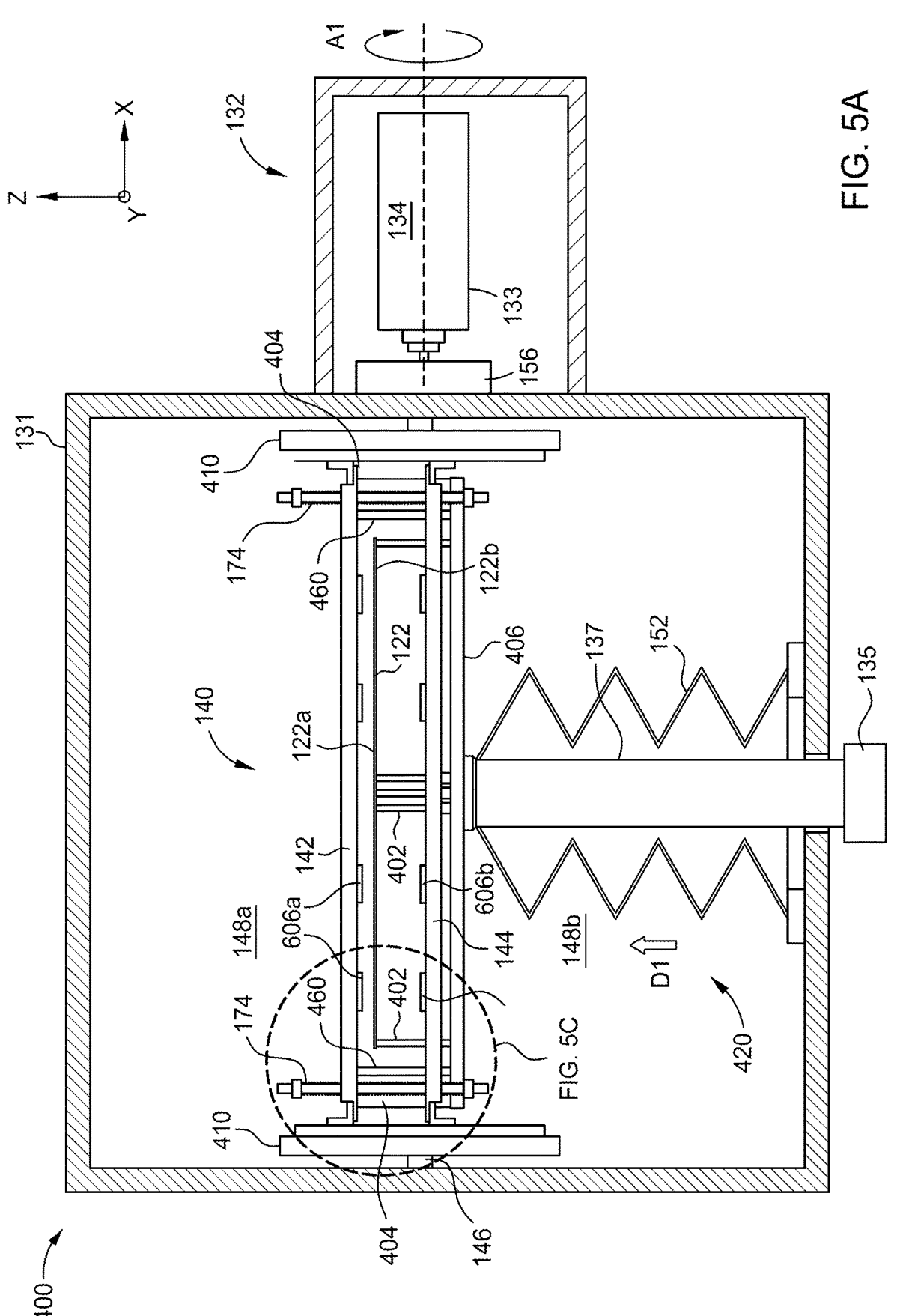
FIG. 5A is partial side cross-sectional view of the flipper module in the open position, according to certain embodiments.

FIG. 3A further shows how the load lock chamber 120 also may include a plurality of sensors 180, 182, 184, 186. Each of the sensors 180, 182, 184, 186 of the plurality of sensors 180, 182, 184, 186 are optical sensors but may also be proximity, pressure, rotation, temperature, other sensors, or any combination thereof for analyzing the characteristics of the chamber 120 and substrate 122. According to some embodiments, a panel or substrate presence sensor 180 reads if a substrate 122 has been positioned within the chamber 120 or flipper module 130. A panel or substrate transfer sensor 182 reads if a substrate 122 has been released by the transfer robot 124. A panel or substrate rotation sensor 184 reads how much the substrate 122 has been rotated during a flipping process, for example, the flipping process of FIG. 2 (described below). For context, the amount the substrate 122 has been rotated can indicate if the module 130 is ready to perform another step in a flipping operation. A clamp position sensor 186 reads if a substrate 122 is currently secured by the flipper module 130 during a flipping process. The substrate is not secured when the clamp assembly, as shown in FIG. 4A, is in an open position and the substrate 122 is secured when the clamp assembly, as shown in FIG. 5A, is in a closed position. As shown in FIG. 3A, the plurality of sensors 180, 182, 184, 186 are positioned on the exterior of the chamber 120, but may be disposed within the chamber 120 in some embodiments. According to some embodiments the plurality of sensors 180, 182, 184, 186 may be connected to the controller 126 to monitor and control the module 130.

Figure 3B:
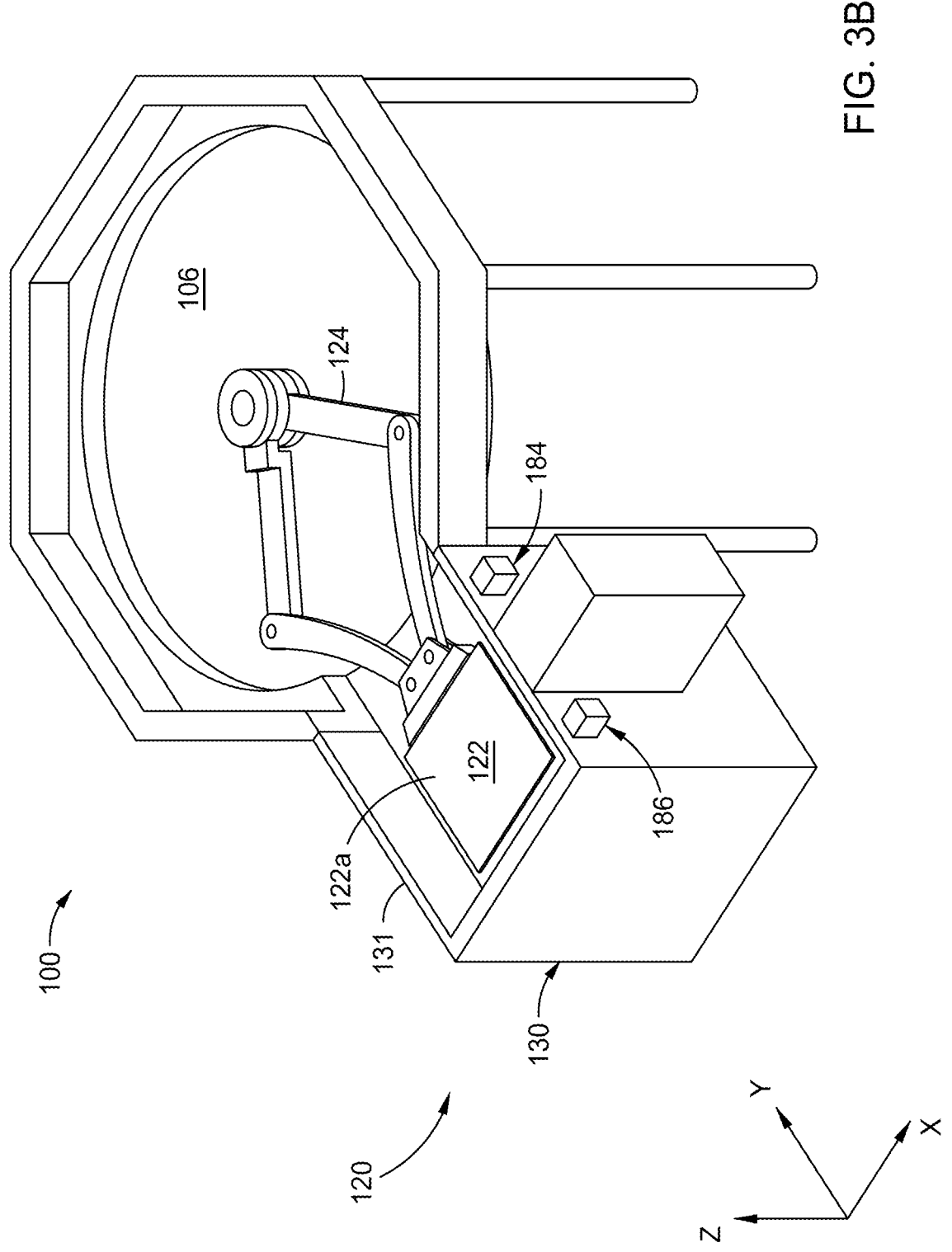
FIG. 3B is a schematic top isometric view of a portion of the substrate processing system of FIG. 1 including a flipper module, according to certain embodiments.

FIG. 3B illustrates the substrate 122 once the transfer robot 124 transfers the substrate 122 from the transfer chamber 106 into the flipper module 130. Note that in FIG. 3B, only the transfer chamber 106 and the flipper module 130 of the second load lock chamber 120 are shown for clarity. Also, note that upper portion of the load lock chamber is omitted in order to illustrate an interior of each respective chamber. As shown in FIG. 3B, the transfer robot 124 has moved the substrate 122 from the transfer chamber 106 into a housing 131 of the flipper module 130. Once the substrate is in the flipper module 130 the transfer robot can release the substrate 122 and allow the flipper module 130 to provide support to the substrate 122.

Figure 4B:
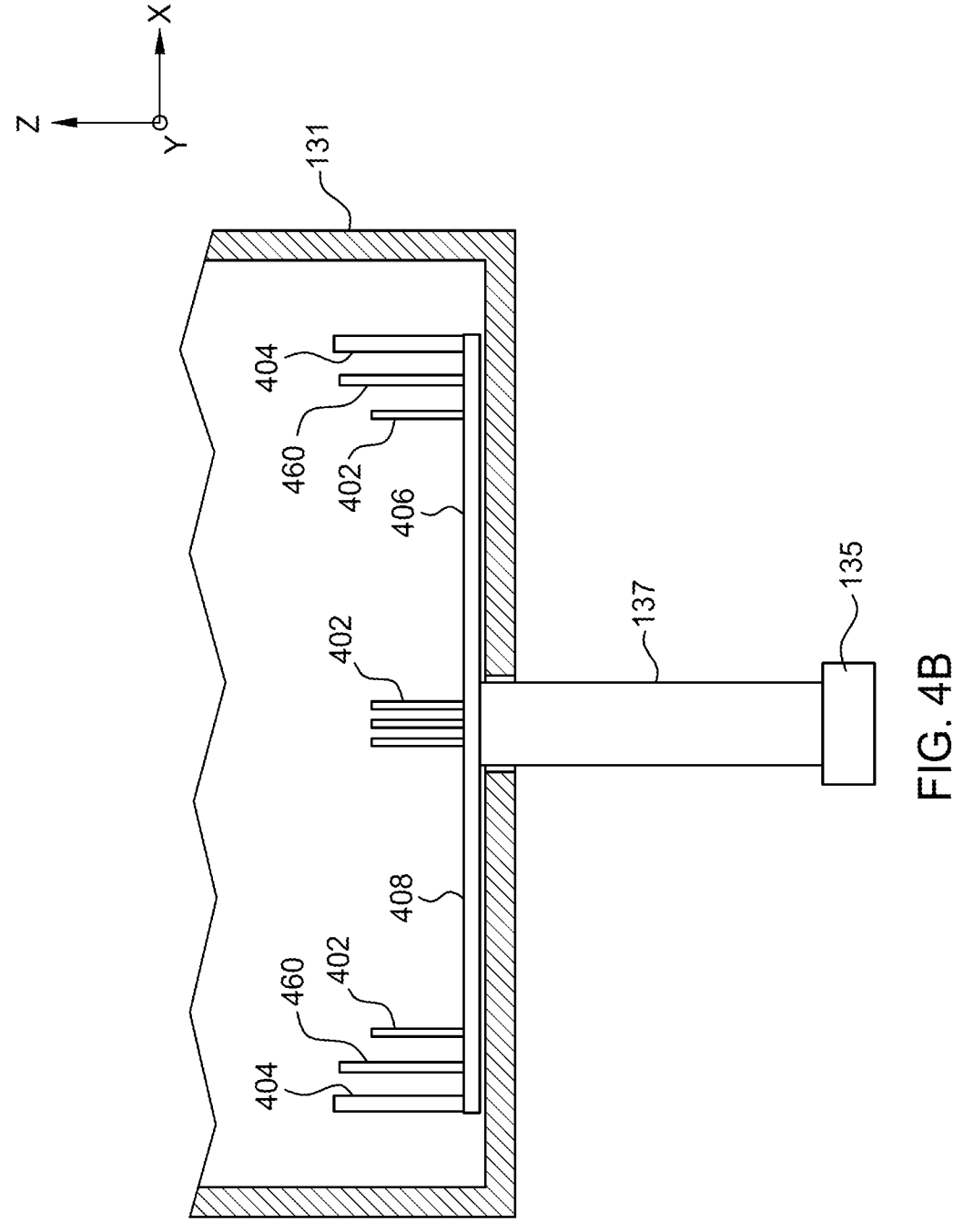
FIG. 4B is partial side cross-sectional views of the flipper module in the closed position, according to certain embodiments
Figure 5B:
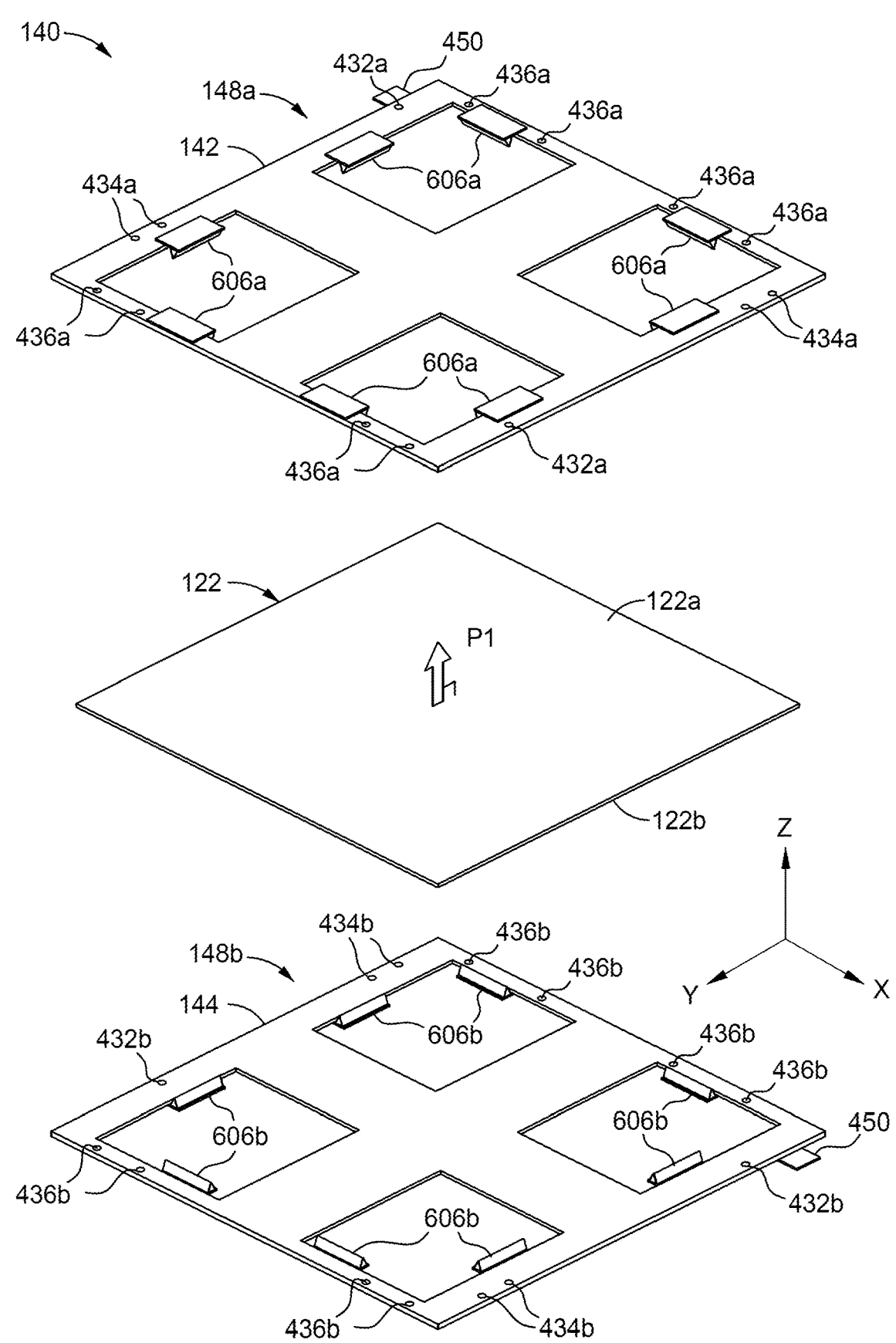
FIG. 5B is a partial exploded view of the clamp assembly according to certain embodiments.
Figure 5C:
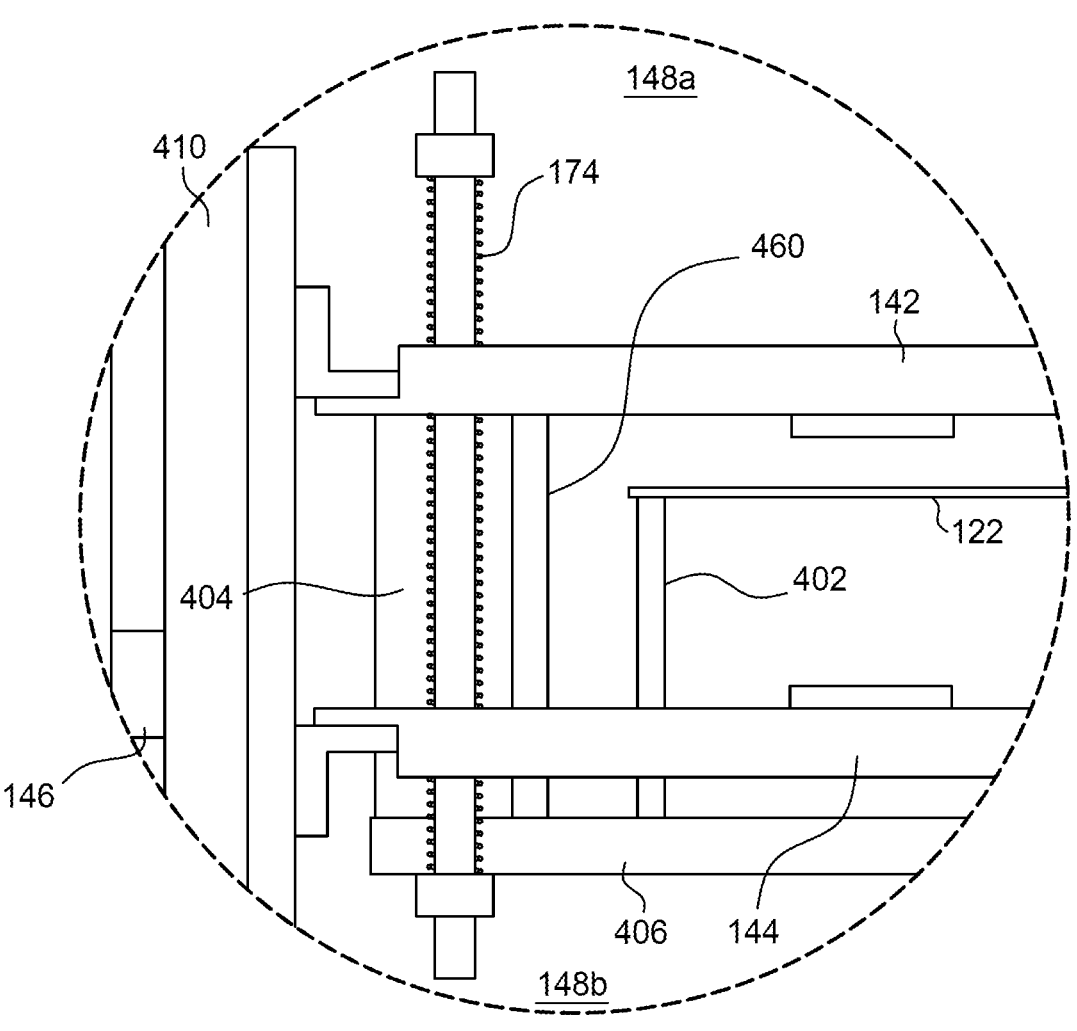
FIG. 5C is a section view of the clamp assembly according to certain embodiments.
Figure 6A:
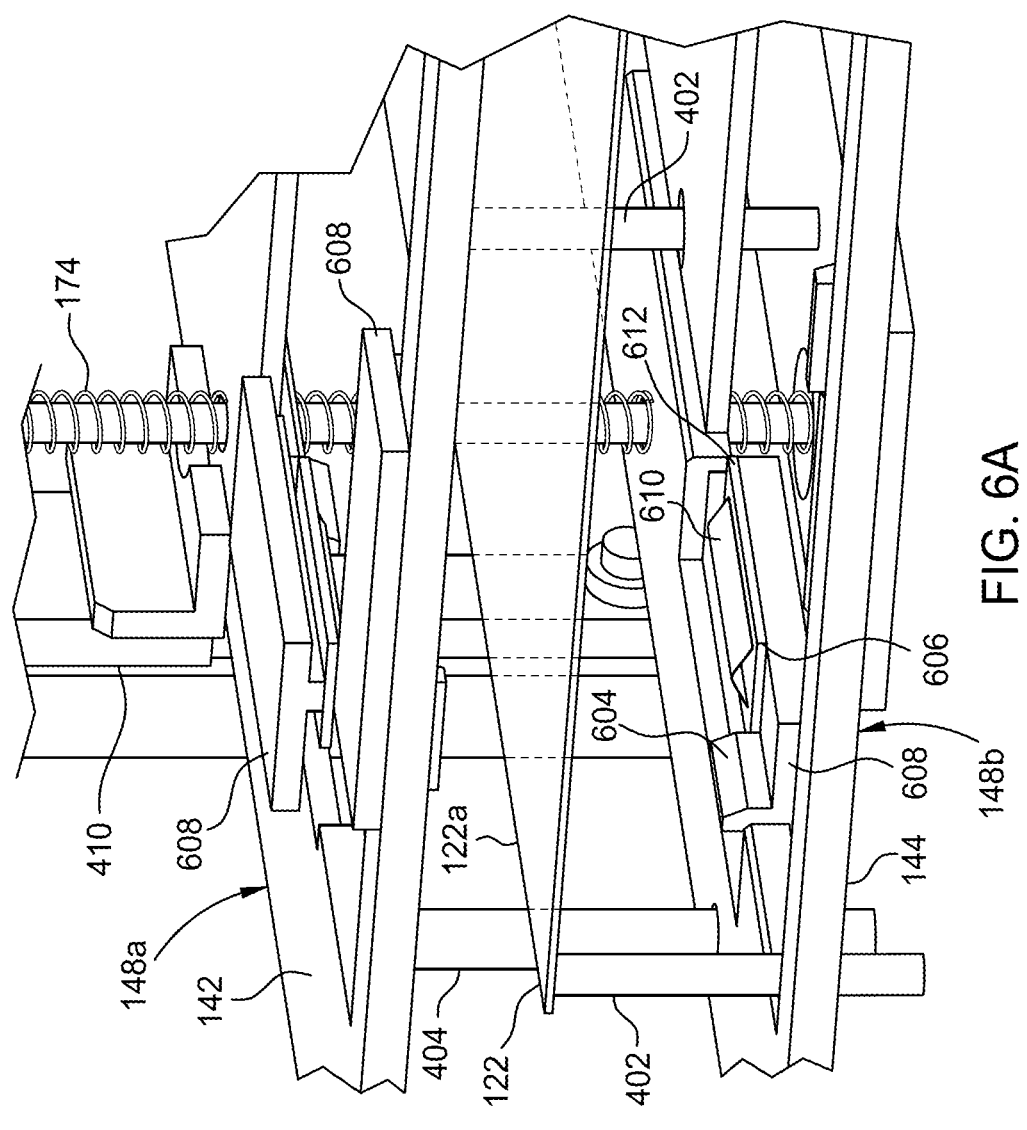
FIG. 6A is a detailed perspective view of a substrate supported by a lift pin, according to certain embodiments.
Figure 6B:
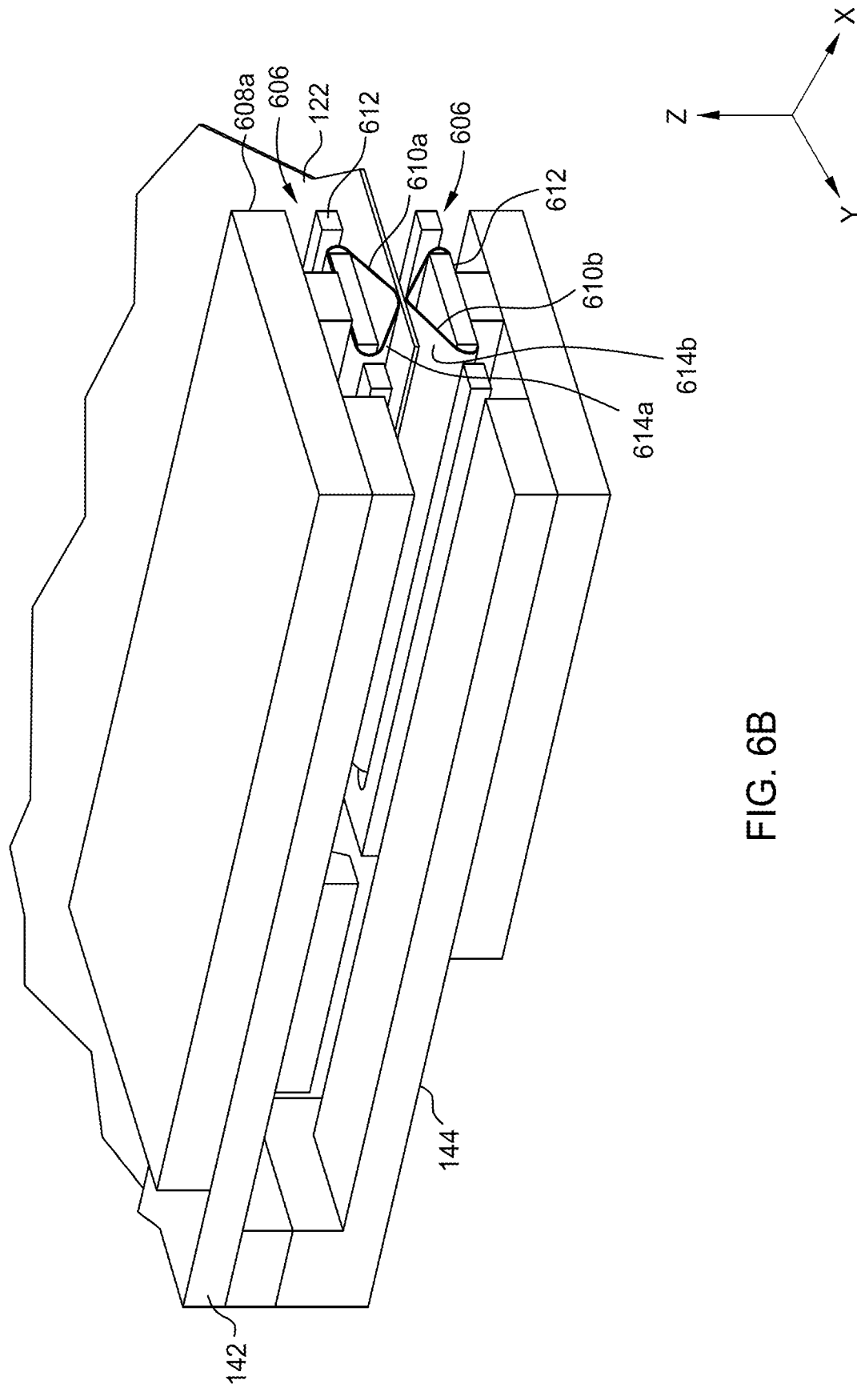
FIG. 6B is a detailed perspective view of a guideblock and substrate support element, according to certain embodiments.
Figure 6C:
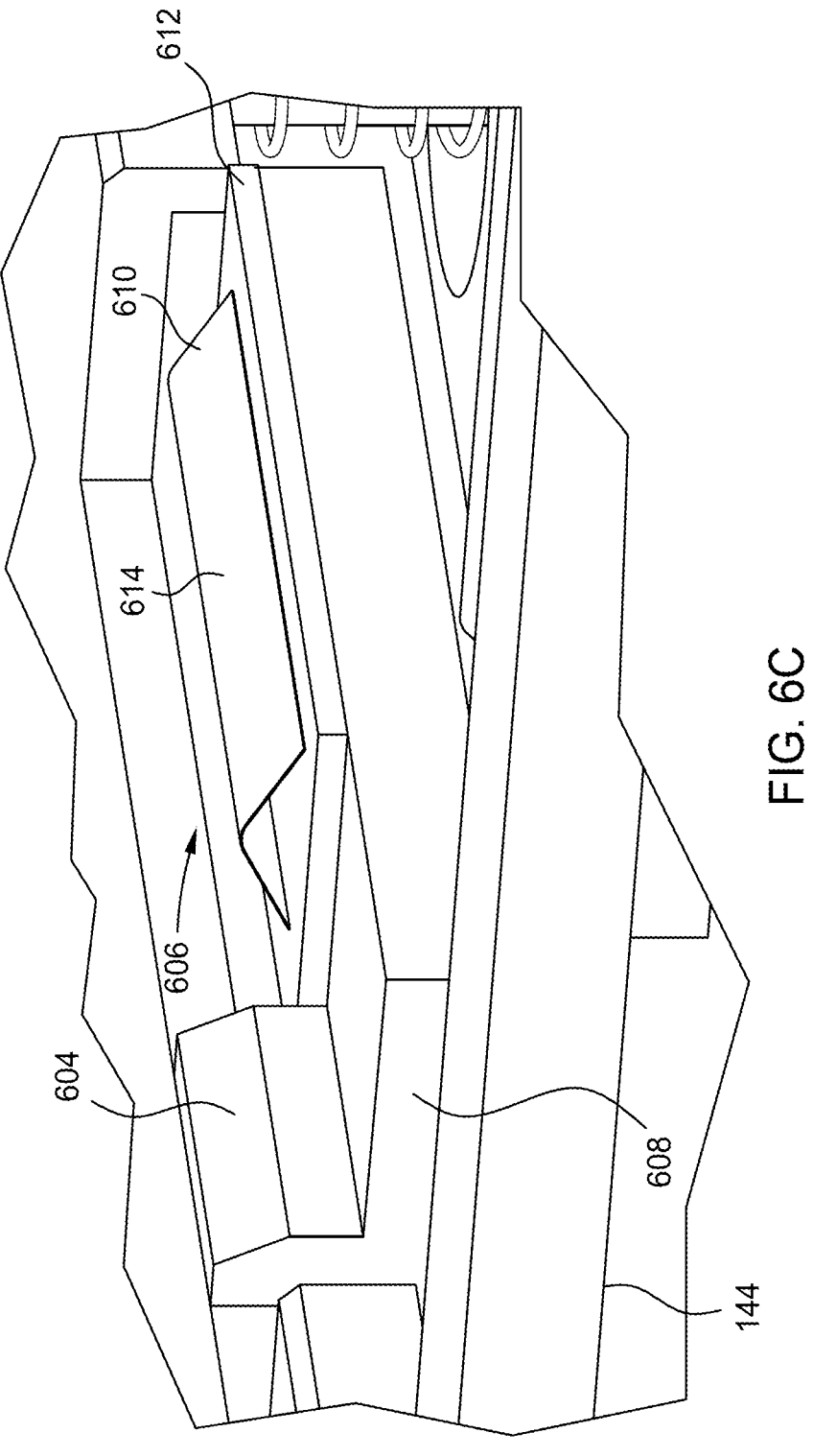
FIG. 6C is a detailed perspective view of a guideblock and substrate support element holding a substrate, according to certain embodiments.

FIG. 4A illustrates a schematic representation of the flipper module 130 that includes a clamp assembly 140, a motor assembly 134, and the lift pin plate assembly 420, according to some embodiments, in a closed position (also referred to as a "clamped position"), for rotation. FIG. 4B illustrates the lift pin plate assembly 420 according to some embodiments, in a lowered position. FIG. 5A illustrates a schematic representation of the flipper module 130 in an open position for receiving or removing a substrate 122 from the flipper module 130. FIG. 5B illustrates an exploded perspective view of part of a clamp assembly 140, according to some embodiments. FIG. 5C is a close up view of a portion of the clamp assembly 140 in the open position shown in FIG. 5A. FIG. 6A is detailed perspective view of a portion of the clamp assembly 140 in the open position, with the substrate 122 positioned and supported by the plurality of lift pins 402 according to some embodiments. FIG. 6B illustrates a detailed view of a plurality of finger-stocks 610a, 610b holding the substrate 122 when the clamp assembly 140 has closed on the substrate 122 according to some embodiments. FIG. 6C is close up view of a plurality of substrate support elements 606a, 606b illustrated in FIG. 6A.

Clamped Position

As shown in FIG. 4A, the flipper module 130 illustrates the clamp assembly 140, which is held within vacuum environment 131a along with a lift pin plate assembly 420, while the motor assembly is disposed on an exterior of the module housing 131, and not within the vacuum environment 131a. According to some embodiments, the motor assembly 134 includes a housing 132, a motor 133 and a shaft and seal assembly 156. The motor 133 is configured to rotate the clamp assembly 140 around a first axis A1. In the clamped position, the lift pin plate assembly 420 is out of the rotational path of the clamp assembly 140. The rotation path of the clamp assembly 140 is formed about the first axis A1, by use of the motor assembly 134.

As illustrated in FIGS. 4A-5B, the clamp assembly 140 includes a first clamp assembly 148a, a second clamp assembly 148b, at least one of two or more clamp sliders 410, and at least one of two or more spring-loaded connectors 174. The first clamp assembly 148a includes a first plate 142, and the second clamp assembly 148b includes a second plate 144. The first and second plates 142, 144 are held parallel to each other by the clamp sliders 410. The one or more clamp sliders 410 are meant to provide a link between the first plate 142 and the second plate 144 to help keep them parallel and also allow a mechanical bias force, provided by one of two or more spring-loaded connectors 174.

As shown in FIG. 4A, the motor assembly 134 is connected to the clamp assembly 140 by a shaft and seal assembly 156. The shaft and seal assembly 156 is connected to at least one or more clamp sliders 410 through the module housing 131. A bearing 146 is coupled to the interior of the housing 131 to the clamp sliders 410 connected to the side of clamp assembly 140 side opposite the motor assembly 134. The bearing 146 is in line with the first axis A1 and supports the clamp assembly 140. The shaft and seal 156 allow rotation motion to be transferred from the motor 133 to the clamp assembly 140 while maintaining a vacuum environment in the process system 100. As shown in FIG. 4A, the first axis A1 is parallel to the X axis. The motor 133 may include programed stops every 180° and be an electric, gear drive, or belt drive motor assembly, but other types are contemplated.

As shown in FIG. 4B, the lift pin plate assembly 420 includes a lift pin plate 406 coupled to an actuator 135 by the actuator shaft 137. The actuator 135 is coupled to the housing 131 of the flipper module 130. The actuator 135 extends and retracts the lift pin plate assembly 420 along a first direction D1 parallel to the Z-axis. The actuator axis is parallel to the Z-direction in the coordinate system of FIG. 4A. The lift pin plate assembly 420 includes a plurality of lift pins 402 extending from a lift pin plate surface 408 and a plurality of clamp assembly pins 404 extending from the lift pin plate surface 408. Additionally, the lift pin plate assembly 420 may include a plurality of clamp alignment pins 460 extending, along the first direction D1, from the lift pin plate surface 408.

The lift pin plate assembly 420 includes the plurality of lift pins 402, the plurality of clamp assembly pins 404, and the plurality of clamp alignment pins 460 that are aligned in the first direction D1. During a flipping operation the lift pin plate 406 is lowered out of a rotational path of the clamp assembly 140 by the actuator 135. In some embodiments, the actuator is outside of the housing 131, at standard pressured while the actuator shaft 137 is disposed within the housing 131 and the actuator 135 and actuator shaft 137 are sealed by use of a bellows assembly to prevent loss of vacuum pressure.

The plurality of lift pins 402 are configured to support and receive the substrate 122 when the actuator 135 extends the lift pin plate assembly 420 into the clamp assembly 140. As shown in FIG. 5A, the clamp assembly pins 404 are configured to contact and hold open the clamp assembly 140 when the actuator 135 extends the lift pin plate assembly 420 into the clamp assembly 140 as described in more detail below. The clamp alignment pins 460 are configured to align the clamp assembly 140 when the clamp alignment pins 460 pass through alignment apertures 436a-b, as seen in FIG. 5B. The clamp alignment pins 460 pass through alignment apertures 436a-b in the clamp assembly perpendicular to the first plane P1.

As shown in FIG. 4A, the spring-loaded connectors 174 mechanically bias a first plate 142 and a second plate 144 of the clamp assembly towards a closed position. The spring-loaded connectors 174 are coupled to the first and second clamp assemblies 148a, 148b. There are at least one or more clamp sliders 410 are coupled to the clamp assembly 140. The clamp sliders 410 are coupled to the motor assembly 134 so the motor 133 transfers rotational energy to the clamp assembly 140 through the clamp slider 410. Another clamp slider 410 is positioned opposite to the clamp slider 410 near the motor assembly 134, on the left side of FIG. 4A, is coupled to a bearing 146 for support during rotation of the clamp assembly 140 as part of the performance of method 200. The bearing is coupled to the interior of the flipper module 130.

The finger-stocks 610a, 610b of the substrate support elements 606 contact the substrate 122 as the clamp assembly 140 closes, after a plurality of guide-blocks 608a, 608b align the substrate 122 relative to the center of the clamp assembly 140. The guide-blocks 608a, 608b may stay in contact with the substrate during rotation. The finger-stocks 610a, 610b are coupled to a plurality of guide-blocks 608a, 608b by finger-stock plates 612 as seen in FIG. 6B. The substrate supporting surfaces 614a, 614b of the finger-stocks 610a, 610b, respectively, are aligned in a parallel orientation to the first plane P1, as shown in FIG. 5B. The finger-stocks 610a, 610b are coupled to the finger-stock plates 612 by a clip geometry, but other coupling methods are contemplated. In one example, the clip geometry of the finger-stocks 610a, 610b includes a flexible alloy member that includes features that engage with, or "snaps" to, a supporting component or body. The finger-stock plate 612 may contain one or more metals such as aluminum, aluminum alloys, steel, stainless steel, alloys thereof or any combination thereof. The finger-stocks 610a, 610b contain a flexible copper alloy, but other materials may be used for the finger-stocks 610a 610b. For example the finger-stocks 610a, 610b may contain beryllium copper with a nickel tin coating or other similar metal coating. As shown in FIG. 6B, the finger-stocks 610a, 610b have a triangular shape, but other embodiments are considered. Each of the finger-stocks 610a, 610b may include a flexible member of any shape, which when used in combination with other finger-stocks 610a, 610b is capable of contacting, supporting and/or holding the substrate 122. The substrate 122 is held in position between the first plate 142 and the second plate 144 so that the clamp assembly 140 in the clamped position can rotate the substrate 122 without the substrate 122 shifting.

According to some embodiments and as shown in FIG. 6B, the finger-stock contact surface 614 is configured to deflect when the force provided by the spring-loaded connectors 174 causes the first plate 142 and the second plate 144 of the clamp assembly 140 to contact the substrate 122. The finger-stocks 610 are disposed to only contact the substrate 122 in certain 10 millimeter (mm) wide predetermined zones. The predetermined zones can be limited to the substrate surfaces 122a-b, 10 mm from the edge of the substrate 122c and in a cross with 10 mm wide strips extending across the substrate surfaces 122a-b. Other predetermined zones and zone dimensions are contemplated. These predetermined zones enable minimal damage to the substrate surfaces 122a-b and maximize production.

As shown in FIGS. 6A, 6B, and 6C, the first plate 142 and second plate 144 each include a plurality of substrate support elements 606 and a plurality of guide-blocks 608. The plurality of guide-blocks 608 can be coupled to the first and second plates 142, 144 using mechanical fasteners, but other methods are also contemplated. According to some embodiments, the substrate support elements 606 include finger-stock plates 612 (also referred to as a "finger-stock base") and finger-stocks 610a, 610b coupled to the finger-stock plate 612. The finger-stock plate 612 may include one or more metals such as aluminum, aluminum alloys, steel, stainless steel, alloys thereof, a polymer, or a ceramic, or any combination thereof. The substrate support element 606 may also be coupled directly to the first and second plates 142, 144. The guide-blocks 608 are coupled to the first plate 142 and second plate 144, and are used to help align and position a substrate 122 within the clamp assembly 140. Each guide-block 608 also includes an alignment face 604. The plurality of guide-blocks 608 may be made of a one or metals such as aluminum, aluminum alloys, steel, stainless steel, alloys thereof or any combination thereof. A polymer is also contemplated. As the clamp assembly 140 closes on the substrate 122, any misalignment in the X-Y plane of the substrate 122 can be corrected by the guide-blocks 608. The misaligned substrate outer edges 122c will contact the alignment face 604 causing the substrate 122 to slide into alignment within the clamp assembly 140. Prior to flipping a substrate 122, as the clamp assembly 140 closes on the substrate 122, any misalignment of the substrate 122 within the clamp assembly 140 will be corrected as the edge of the substrate 122c contacts and follows the contour of the guide-block alignment face 604, and thus due to gravity cause the substrate 122 to move into a proper location as the plurality of lift pins 402 lower the substrate 122 into a position where the substrate 122 rests on the plurality of finger-stocks 610. In some embodiments, the plurality of guide-blocks 608 are capable of correcting up to 7 mm for example 4 mm off center, at least to 2 mm away from the predetermined location.

Open Position

As illustrated in FIG. 5A, when the clamp assembly 140 is in the open position the module is properly oriented to receive a substrate, or ready for a substrate to be removed from the clamp assembly 140.

The clamp assembly 140 is in the open position when the clamp assembly pins 404 of the lift pin plate assembly 420 are in contact with an opposing plate of the clamp assembly 140. As shown in FIG. 5A, the clamp assembly pins 404 work against the bias force of the spring-loaded connectors 174 to separate the opposing plate of the clamp assembly 140 from the substrate 122. The clamp assembly pins 404 contact the first plate 142, which is on an opposing side of the clamp assembly 140, and thus pass through the second plate 144 when the clamp assembly 140 is positioned in this orientation. As shown in FIG. 5A, the plurality of lift pins 402 pass through the first plate 142 or second plate 144 to contact and support the substrate 122. The first and second plates 142, 144 further comprise a plurality of apertures 432*a-b*, 434*a-b*, 436*a-b*, as seen in FIG. 5B. When in the open position, the clamp assembly pins 404 pass through apertures 432*a-b*, 434*a-b* depending on whether the first plate 142 or second plate 144 is closer to the lift pin plate assembly 420, due to its flipped orientation (e.g., which plate is on the top or bottom of the clamp assembly 140). In general, the first and second plate apertures 432*a-b*, 434*a-b* are configured so that the clamp assembly pins 404 will only contact the plate that is on the opposite side of the lift pin plate assembly 420. The plate apertures 432*a-b*, 434*a-b* of the plate nearer to the lift pin plate assembly 420 will allow the clamp assembly pins 404 to pass therethrough.

As seen in FIGS. 5A and 5C, once the lift pin plate assembly 420 is extended to place the clamp assembly 140 in the open position, a substrate 122 can be removed from or placed within the clamp assembly 140. When a substrate 122 is positioned within the clamp assembly 140 in the open position, it is supported by the plurality of lift pins 402. According to some embodiments, if the substrate 122 is positioned within the flipper module 130 a presence sensor 180 can be used to indicate that the substrate 122 is no longer moving and in the correct position within the clamp assembly 140. Additionally, the transfer sensor 182 can be used to indicate when the transfer robot 124 has released the substrate 122 and that the substrate 122 is only supported by the plurality of lift pins 402.

As shown in FIG. 5B, the substrate 122 is positioned between the first and second plates 142, 144 according to some orientations. The first and second plates 142, 144 have openings that allow the plurality of substrate support elements 606*a*, 606*b* to be located within the bounds of the first and second plates 142, 144. The plurality of substrate support elements 606, such as substrate support elements 606*a*, 606*b* illustrated in FIG. 5B, are configured to contact the substrate 122 once the clamp assembly 140 closes, as illustrated in FIGS. 4A and 6B. As noted above, the areas where the finger-stocks 610*a*, 610*b* (FIG. 6B) of the substrate support elements 606*a*, 606*b* (FIG. 5B) contact the substrate 122 may be predetermined to minimize contact between the clamp assembly 140 and the substrate 122 thereby increasing the usable area of the substrate 122.

As seen in FIGS. 5A and 5C. The clamp assembly 140 is held open against the bias of the spring-loaded connector 174 by the clamp assembly pins 404 that are pressing against the first plate 142. The clamp alignment pins 460 passing through the plurality of clamp alignment apertures 436*a*, 436*b* keep movement of the clamp assembly 140 limited to the first direction D1 and align the first plane P1 perpendicular to the first direction D1.

FIG. 6A illustrates a corner of the clamp assembly 140 in the open position according to some embodiments. As seen in FIGS. 6A and 6C, in the open position, the plurality of guide-blocks 608 are not supporting the substrate 122 in the open position. Instead, in the open position, only the lift pins 402 are in contact with the substrate 122.

Figure 6D:
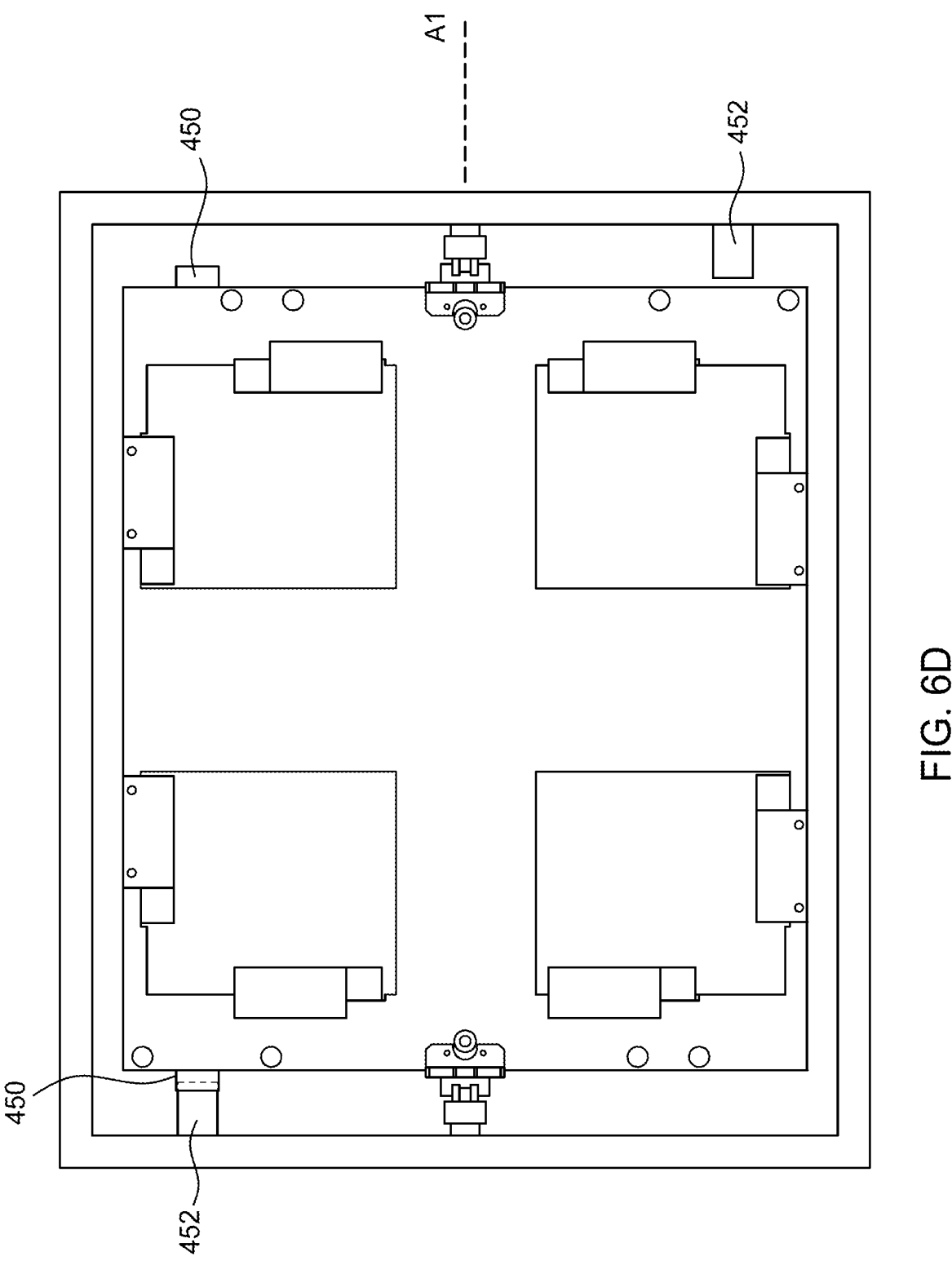
FIG. 6D is a top view of a clamp assembly contacting a backstop, according to certain embodiments.

FIG. 6D is a top view of the flipper module 130 showing a backstop assembly. The backstop assembly includes one or more backstop plates 450 and one or more backstop modules 452. A backstop plate 450 is coupled to the first plate 142 and another backstop plate 450 is coupled to the second plate 144 (obscured from view under first plate 142). The backstop plates 450 are configured to contact the backstop modules 452 once the clamp assembly 140 is rotated. According to some embodiments, the clamp assembly 140 is first rotated clockwise 180° about the axis of the motor 133 (as shown in FIG. 4A) to flip a first substrate and then rotated 180° counter clockwise about the axis of the motor 133 to flip the next substrate. The clamp assembly 140 stops rotation once the backstop plate 450 contacts the backstop modules 452 after each flip. The backstop plates 450 and the backstop modules 452 are configured to stop rotation of the clamp assembly 140 and prevent over travel of the clamp assembly 140. According to some embodiments a sensor 184 (as shown in FIG. 3A) is configured to monitor when the backstop plates 450 contacts the backstop modules 452.

Exemplary Flipper Method of Use

FIG. 2 illustrates a method of flipping a substrate. At operation 202, as seen in FIG. 3B, the substrate 122 is transferred from the transfer chamber 106 into the flipper module 130. During operation 202, the process system 100 moves the substrate 122 into a position for the clamp assembly 140 to receive the substrate 122 (FIG. 3A).

Operation 204 begins with the clamp assembly 140 in the open position, as seen in FIG. 5A. The substrate is received on the plurality of lift pins 402 because the lift pin plate assembly 420 is positioned to contact the clamp assembly 140 and hold it open. In other embodiments the clamp assembly 140 is raised from the lowered position before operation 202. The clamp assembly pins 404 of the clamp assembly contact the plate 142, 144 opposite the lift pin plate assembly 420 and keep the clamp assembly 140, open against the bias force of the spring-loaded connectors 174. Once the substrate 122 has been received on the plurality of lift pins 402, the actuator 135 retracts the lift pin plate assembly 420, at which point the plurality of lift pins 402 deposit the substrate on the finger-stock contact surfaces 614 such that the substrate lift pins 402 no longer support the substrate 122. Additionally, as the lift pin plate assembly 420 continues to move away from the clamp assembly 140 and towards the lower portion of the module housing 131, as shown in FIG. 4B, the clamp assembly pins 404 disengage from the plate 142 of the clamp assembly 140 and the spring-loaded connectors 174 bias the first and second plates 142, 144 to a closed position as illustrated by FIGS. 4A and 6B. In the closed position the plurality of substrate support elements 606*a* and 606*b* contact the substrate 122 on both the first side of the substrate or front side 122*a* and the second side of the substrate or backside 122*b*, respectively, as shown in FIG. 6B.

At operation 206, the lift pin plate 406 has been lowered out of the way of the clamp assembly's rotation. The clamp assembly 140 is rotated by about 180° by the motor 133. The orientation of the clamp assembly 140 and the substrate 122 secured therein is then considered to be "flipped" after the clamp assembly 140 is rotated by about 180°. For example, after rotation, the top face of the substrate 122*a* is oriented downward and the backside of the substrate 122*b* of the substrate 122 is oriented upward. The front side 122*a* remains in contact with the substrate support elements 606*a* of the first assembly 148*a*, and the backside 122*b* remains in contact with the substrate support elements 606*b* of the second assembly 148*b* during rotation because the clamp assembly 140 remains closed around the substrate 122 due to the bias applied by the spring-loaded connectors 174. The clamp assembly 140 stops rotation once the back stop assembly plate 150 come in contact with a backstop 452. In other embodiments, rotation determination methods may include an encoder attached to the motor 133 and a sensor to indicate a desired rotation has been reached.

At operation 208, the lift pin plate is raised once again to open the clamp assembly 140 to resemble to orientation shown in FIG. 5A. However, at operation 208, the first plate 142 and the second plate 144 have switched locations so that the second plate 144 is positioned over the first plate 142. The actuator 135 extends the lift pin plate assembly 420 to contact the clamp assembly 140 and hold it open by the clamp assembly pins 404 contacting the plate 142, 144 opposite the lift pin plate assembly 420. The plurality of clamp assembly pins 404 pass through apertures 432*a*, 434*a* within the first plate 142 to contact the second plate 144. The plurality of spring-loaded connectors 174 no longer secure the substrate 122 within the clamp assembly 140 and the substrate 122 rests on the lift pins 402.

At operation 210, the substrate 122 is transferred out of the flipper module 130. The transfer out of the flipper module may be by use of the transfer robot 124 but other means are contemplated. According to some embodiments, the transfer robot 124 removed a flipped substrate 122 from the lift pins 402 and flipper module 130, and transfers the flipped substrate 122 into a transfer chamber 106. When the substrate 122 is transferred back into the transfer chamber 106 after being flipped, the preclean and/or deposition processes can be performed on unprocessed side. As described above, the substrate 122 is maintained in vacuum during each operation of the method 200. Therefore, when the substrate 122 is transferred back into the transfer chamber 106, there is no need for degassing of the substrate 122 prior to performing subsequent preclean and/or deposition processes on the backside 122*b*. This results in a significant time savings and increased throughput for dual sided processing.

While the foregoing is directed to embodiments of the present disclosure, other and further embodiments of the disclosure may be devised without departing from the basic scope thereof, and the scope thereof is determined by the claims that follow.

What is claimed is:

1. A module of a processing system, comprising:
a substrate clamp assembly, comprising:
a first plate assembly comprising:
a first plate; and
a plurality of first substrate support elements coupled to the first plate, wherein each first substrate support element has a first substrate supporting surface;
a second plate assembly comprising:
a second plate; and
a plurality of second substrate support elements coupled to the second plate, wherein each second substrate support element has a second substrate supporting surface, wherein the first substrate supporting surfaces and the second substrate supporting surfaces are aligned in a parallel orientation to a first plane;
a plurality of guide-blocks comprising:
a first plurality of guide-blocks coupled to the first plate; and
a second plurality of guide-blocks coupled to the second plate; and
a connector that biases the first plate towards the second plate;

a motor assembly coupled to the substrate clamp assembly, and configured to rotate the substrate clamp assembly about a first axis that is parallel to the first plane, and orient the first substrate supporting surfaces and the second substrate supporting surfaces in a first orientation;
a lift pin plate assembly comprising:
a lift pin plate;
a plurality of clamp assembly pins coupled to the lift pin plate; and
a plurality of lift pins coupled to the lift pin plate, wherein the plurality of lift pins and the plurality of clamp assembly pins extend in a first direction;
a lift pin actuator configured to position the plurality of lift pins in the first direction and within openings formed in the first plate when the first substrate supporting surfaces and the second substrate supporting surfaces are positioned in the first orientation, the lift pin actuator configured to move the lift pin plate assembly in a first direction to configure the clamp assembly in an open position and overcome the bias of the connector.

2. The module of claim 1, further comprising:
one or more backstop plates coupled to the first plate or the second plate of the substrate clamp assembly, wherein the backstop plates are positioned to contact a backstop module disposed within the module and positioned a distance from the first axis.

3. The module of claim 1, further comprising:
a plurality of spring-loaded connectors coupled to the substrate clamp assembly.

4. The module of claim 1, wherein each first substrate support element is coupled to a respective guide-block from the plurality of guide-blocks; and
the module further comprises a plurality of spring-loaded connectors coupled to each of the first and second plates.

5. The module of claim 1, wherein the plurality of guide-blocks comprise an alignment surface, wherein each first substrate support element extends from a respective guide-block of the plurality of guide-blocks in a direction perpendicular to the major plane of the first plate.

6. The module of claim 1, further comprising a plurality of sensors coupled to a chamber, wherein:
the substrate clamp assembly and the lift pin plate are disposed within the chamber, and
at least one sensor from the plurality of sensors includes:
a clamp position sensor,
a substrate presence sensor,
a substrate transfer sensor, or
a substrate rotation sensor.

7. The module of claim 1, wherein the lift pin plate assembly further comprises:
a plurality of clamp alignment pins coupled to a lift pin plate, wherein the plurality of clamp alignment pins extend in the first direction.

8. The module of claim 1, wherein the plurality of first and second substrate support elements are each configured to receive a substrate with a thickness in a range from about 0.2 mm to about 3.2 mm.

9. A processing system, comprising:
a deposition chamber;
a transfer chamber coupled to the deposition chamber; and
a load lock chamber coupled to the transfer chamber, wherein the load lock chamber comprises a module, wherein the module comprises:

a clamp assembly, wherein the clamp assembly comprises:

a first plate;

a second plate parallel to the first plate, the second plate movably coupled to the first plate in a direction perpendicular to a major plane of the first plate;

a first plurality of guide-blocks coupled to the first plate;

a second plurality of guide-blocks coupled to the second plate;

a connector that biases the first plate towards the second plate;

a first plurality of substrate support elements coupled to the first plate; and a second plurality of substrate support elements coupled to the second plate;

an actuator configured to overcome the bias of the connector;

a lift pin assembly disposed within the load lock chamber, the lift pin assembly comprising:

a lift pin plate coupled to the actuator, wherein the actuator is configured to move the lift pin plate in a first direction to configure the clamp assembly in an open position;

a plurality of clamp assembly pins coupled to the lift pin plate; and a plurality of lift pins coupled to the lift pin plate;

a motor assembly coupled to the clamp assembly of the module;

one or more backstop plates coupled to the clamp assembly; and a plurality of sensors in communication with the module.

10. The processing system of claim 9, wherein the load lock chamber further comprises:

one or more backstops coupled to the load lock chamber, wherein one or more of the backstop is configured to prevent over travel during rotation of the clamp assembly.

11. The processing system of claim 9, wherein the plurality of sensors are optical sensors.

12. The processing system of claim 9, wherein the first plurality of substrate support elements and the second plurality of substrate support elements each comprise an individual finger-stock and a finger-stock base.

13. The processing system of claim 12, wherein each finger-stock comprises a triangular shape and has a contact surface configured to receive the substrate.

* * * * *